United States Patent
Hua et al.

(10) Patent No.: US 8,454,185 B2
(45) Date of Patent: Jun. 4, 2013

(54) HOLLOW, LIQUID COOLING AND STRIP-SHAPED LED LAMP

(75) Inventors: Guichao Hua, Zhejiang (CN); Kun Lang, Zhejiang (CN); Xinke Wu, Zhejiang (CN); Congfeng Zhang, Zhejiang (CN); Wanyu Tang, Zhejiang (CN)

(73) Assignee: THINKLUX (Zhejiang) Lighting Technology Co., Ltd, Hangzhou, Zhejiang (CN)

( * ) Notice: Subject to any disclaimer, the term of this patent is extended or adjusted under 35 U.S.C. 154(b) by 205 days.

(21) Appl. No.: 13/143,871

(22) PCT Filed: Mar. 4, 2010

(86) PCT No.: PCT/CN2010/070862
§ 371 (c)(1),
(2), (4) Date: Jul. 8, 2011

(87) PCT Pub. No.: WO2011/006370
PCT Pub. Date: Jan. 20, 2011

(65) Prior Publication Data
US 2011/0267805 A1 Nov. 3, 2011

(30) Foreign Application Priority Data
Jul. 16, 2009 (CN) .......................... 2009 1 0100681

(51) Int. Cl.
*F21V 9/00* (2006.01)
*F21V 29/00* (2006.01)
*H01L 33/02* (2010.01)
*H05K 13/00* (2006.01)

(52) U.S. Cl.
USPC .............................. 362/101; 362/231; 313/46

(58) Field of Classification Search
USPC ............... 362/101, 231, 294, 249.06, 249.02, 362/253, 246, 230; 313/46; 445/38; 29/840, 29/841
See application file for complete search history.

(56) References Cited

U.S. PATENT DOCUMENTS
8,152,341 B2 * 4/2012 Wheelock et al. ............ 362/373
2008/0246383 A1 10/2008 Chang et al.
2012/0146503 A1 * 6/2012 Negley et al. ................... 315/35

FOREIGN PATENT DOCUMENTS
CN 2735548 Y 10/2005
CN 2881326 Y 3/2007
(Continued)

OTHER PUBLICATIONS
International Search Report (in English) for PCT/CN2010/070862, mailed Jun. 10, 2010.

*Primary Examiner* — Joseph L Williams
(74) *Attorney, Agent, or Firm* — Harness, Dickey & Pierce, P.L.C.

(57) ABSTRACT

The invention discloses a hollow, liquid cooling and strip-shaped LED lamp, comprising an LED driver, an LED light source, and LED substrate, a light distributing lampshade, electrical connectors at two ends and a lamp socket. The invention is characterized in that a hollow inner container is set in the light distributing lampshade. The hollow chamber between the hollow inner container and the light distributing lampshade is filled with heat conducting liquid. The LED substrate is immersed in the heat conducting liquid. The invention conducts heat by conduction and convection of the heat conducting liquid, which can obtain good heat radiating effect. Meanwhile, the inner container and the light distributing lampshade form a hollow radiating shell filled with high performance heat conducting liquid, and the hollow radiating shell can be made of light weight materials. Therefore, the radiating shell is light in weight, environmental friendly, durable and low cost. Especially, since the heat conducting liquid fills in the hollow chamber of the hollow radiating shell directly in the invention, the heat radiating effect will be improved and at the same time the volume of the product will not increase.

9 Claims, 7 Drawing Sheets

FOREIGN PATENT DOCUMENTS

| CN | 2903657 Y | 5/2007 |
| CN | 201141526 Y | 10/2008 |
| CN | 201145244 Y | 11/2008 |
| CN | 201149226 Y | 11/2008 |
| CN | 101457918 A | 6/2009 |
| CN | 101655189 A | 2/2010 |

* cited by examiner

HOLLOW, LIQUID COOLING AND STRIP-SHAPED LED LAMP

CROSS-REFERENCE TO RELATED APPLICATIONS

This application is a 371 U.S. National Stage of International Application No. PCT/CN2010/070862, filed Mar. 4, 2010. This application claims priority to Chinese patent application No. 200910100681.8, filed Jul. 16, 2009. The disclosures of the above applications are incorporated herein by reference.

FIELD OF THE INVENTION

The present invention relates to a strip-shaped LED lamp, in particular to a strip-shaped LED lamp which removes heat with liquid and distributes light by an inner container.

BACKGROUND OF THE INVENTION

At present, in most of lighting instruments commonly available in the market, fluorescent lamps and energy-saving lamps are used as the light source. Generally, those lighting instruments have some disadvantages such as a large consumption of power for their light emitter, a low lighting efficiency, causing pollution after being discarded, a short service life, and sometimes generate strobing which fatigues eyes of people and damages the visual function of people.

Figure 1:
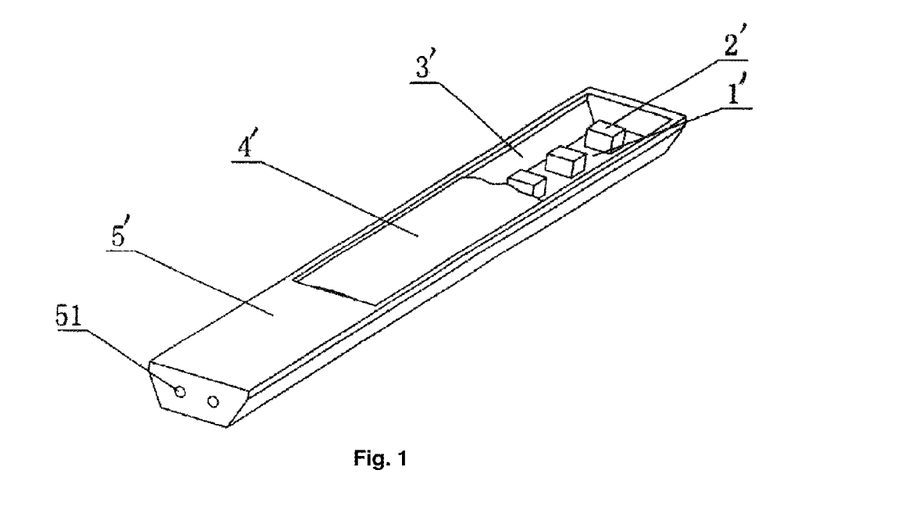
FIG. 1 is a schematic view of a strip-shaped LED lamp illuminating devices in the prior art.

The LED light source saves electrical power up to 80% or more, and has a service life which is more than 10 times that of the conventional fluorescent lamp, and thus almost is free of maintenance. Also for the LED light source, there is no need to frequently replace the light source, ballast and starter, and it is quickly started, has a low power, and has no strobing, which does not easily cause visual fatigue. Its service life is in 50,000-80,000 hours, so it becomes a main product for replacing the daylight lamp and the energy-saving lamps in the conventional lighting instruments currently. However, the high-power LED will generate a lot of heat when working, and there is still no a good solution to solve the heat removing problem. In order to solve the heat removing problem of the high-power LED lamp, the Chinese patent CN2881326Y discloses a strip-shaped LED lamp. Referring to FIG. 1, the strip-shaped LED lamp includes a lamp socket 1', light-emitting diodes 2', a transparent cover 4', an electronic control device 5' and a compatible interface 51. The lamp body is mounted with metal radiating fins of special alloy material. However, in the design of such a conventional strip-shaped LED lamp, the radiating fins used are of metal material, which needs additional volume, and has a large weight and a high cost.

SUMMARY OF THE INVENTION

In order to overcome the disadvantages of the conventional products, the present invention provides a hollow liquid-cooling strip-shaped LED lamp.

In order to solve the technical problems in the prior art, the present invention provides the following technical solutions.

The hollow liquid-cooling strip-shaped LED lamp includes a LED driver, a LED light source, a LED substrate, a light distributing lampshade, electrical connectors at two ends of the lamp and a lamp socket. A hollow inner container is provided in the light distributing lampshade. A chamber between the hollow inner container and the light distributing lampshade is filled with heat conducting liquid, and the LED substrate is immersed in the heat conducting liquid.

For the hollow liquid-cooling strip-shaped LED lamp of the present invention, since the heat removing chamber is filled with heat conducting liquid (for example, water, heat-transfer oil, deionized water or glycol solution or the like) with high heat-transfer capability, heat may be removed by conduction and convection, so as to achieve a good heat removing effect. In addition, the hollow heat removing shell filled with liquid of high heat-transfer capability and consisting of the inner container and the light distributing lampshade may be made of light-weight material. Such a design allows the heat removing shell to have advantages such as light-weighted, environmental protective, durable and economical. Particularly, since the heat conducting liquid is directly filled in the chamber of the hollow heat removing shell in the present invention, the heat removing effect may be improved without increasing the volume of products, and the weight of the heat conducting liquid may be reduced significantly without affecting the heat removing effect. Besides, the LED driver may be disposed within the chamber of the hollow inner container, and the power cord may be passes through the chamber of the hollow inner container.

According to the present invention, two ends of the hollow heat removing shell are connected with the lamp sockets via sealing gaskets.

According to the present invention, the heat conducting liquid may be any solution having a low freezing point, no corrosion, flame retardant and non-toxic, or may be macro-molecule material and nanometer material of gel-like or the like, e.g., water, heat-transfer oil, deionized water or glycol solution or the like. The heat conducting liquid may be electrically-conductive liquid or non-electrically-conductive liquid.

According to the present invention, the light distributing lampshade may be made of plastic, glass, acrylic or other transparent macromolecule materials, preferably light-weight materials.

According to the present invention, the hollow inner container may be made of materials such as metal, alloy, plastic, glass, quartz.

According to the present invention, the outer surface of the hollow heat removing shell may be a glazed surface, or may be a corrugated surface or the like.

According to the present invention, LED driver may be disposed outside the lamp body or may be disposed within the chamber of the hollow inner container of the lamp body.

According to the present invention, the hollow inner container may be designed according to the light distributing requirements, for example, may be processed to increase the light distributing effect or have special structures, such as being polished, having reflective cover, forming into a transparent prism mirror, having reflective coating layer, being formed by reflective glass.

According to the present invention, the strip-shaped lamp may be designed as modules, and may be assembled with the modules according to actual requirements. It is suitable for situations needing high-quality light sources such as advertising box, street lamp, illuminating lamp, landscape lamp, tunnel lamp and spot lamp.

According to the present invention, the outer surface of the hollow inner container is provided with a bracket, and the LED substrate is provided on the bracket. In a preferred embodiment, the LED substrate is provided in sliding grooves provided on the bracket. For such a structure, due to the use of the bracket, the LED substrate is separated from and does not contact with the hollow inner container directly.

Thus, the top surface and the bottom surface of the LED substrate are in contact with the heat conducting liquid, which is advantageous in further improving the heat transferring effect.

According to the present invention, the LED substrate is disposed so as to be closely attached to an outer surface of the hollow inner container.

According to the present invention, the hollow inner container is connected with recesses in the light distributing lampshade by two side fins of the hollow inner container.

According to the present invention, a plurality of LED light sources are disposed on the LED substrate in a single row or multiple rows.

BRIEF DESCRIPTION OF THE DRAWINGS

Hereinafter, the present invention will be further described with reference to drawings, which is not limit to embodiments of the present invention.

DETAILED DESCRIPTION OF THE INVENTION

A schematic view of a strip-shaped LED lamp illuminating devices in the prior art is shown in FIG. 1, and its disadvantages have been described thereinbefore, which will not be described repeatedly.

As shown in FIG. 2, the first embodiment of the present invention is shown. The embodiment of the present invention provides a hollow liquid-cooling strip-shaped LED lamp including electrical connectors 1, a LED driver 2, a LED substrate 3, LED light source(s) 4, a hollow inner container 5, a light distributing lampshade 6, a power cord 7, lamp sockets 8, heat conducting liquid 9 and a bracket 10. The electrical connectors 1 are provided at two ends of the strip-shaped LED lamp, and are connected to the mains supply externally, and are connected to the input end of the LED driver 2 internally. A chamber formed by the hollow inner container 5 and the light distributing lampshade 6 is filled with heat conducting liquid having high heat-transfer capability. The LED driver 2 is provided within a chamber 50 of the hollow inner container. The LED light source 4 is provided on the LED substrate 3. The LED substrate 3 is disposed in sliding grooves 24 provided on the bracket 10. The LED light source 4 is disposed within the light distributing lampshade 6.

In the embodiment, the hollow inner container 5 is inserted in the light distributing lampshade 6, and fixed with the light distributing lampshade 6 by side fins 21 with through hole(s) 22 at the two sides of the hollow inner container 5 and recesses 25 of the light distributing lampshade 6. The bracket 10 is connected with the hollow inner container 5.

In the embodiment, the LED light source 4 is welded on the LED substrate 3. The LED substrate 3 is tightly connected to the lower end of the hollow inner container 5 via the bracket 10 with a little gap between the LED substrate 3 and the hollow inner container 5, such that the LED substrate 3 is entirely immersed in the heat conducting liquid, with its front surface and back surface being in close contact with the heat conducting liquid 9, which facilitates the convection motion of the heat conducting liquid and thus improves the heat removing effect. Thus, heat may be effectively transferred by convection and conduction.

Figure 2A:
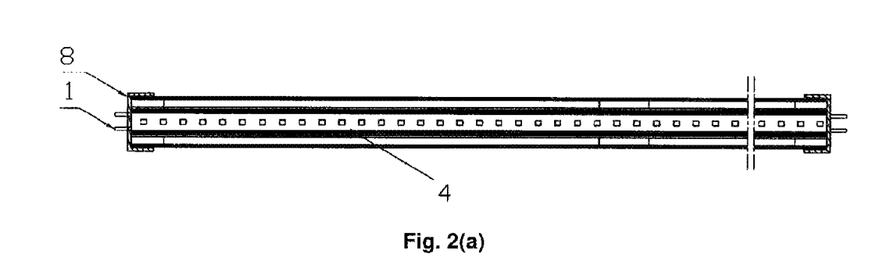
FIG. 2 is a schematic view of a hollow liquid-cooling strip-shaped LED lamp according to a first embodiment of the present invention.
Figure 2B:
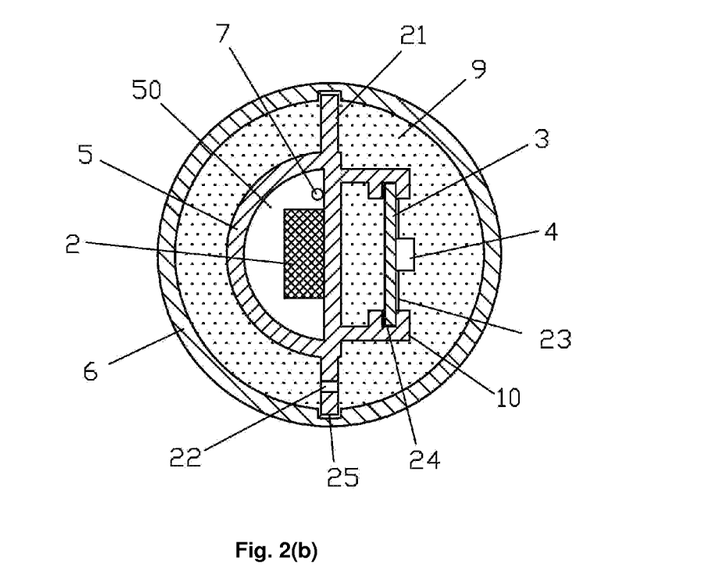

The strip-shaped LED lamp according to the embodiment may be used as LED daylight lamp and "wash wall" and the like, as shown in FIG. 2a and FIG. 2b which shows the section view of the strip-shaped LED lamp.

The electrical connectors 1 in the embodiment may be pin-type connectors which may be compatible with the lamp socket of the conventional daylight lamp when it is used as a daylight lamp, which facilitates the replacing of the daylight lamp with the strip-shaped LED lamp.

In the embodiment, the hollow inner container 5, the light distributing lampshade 6 and the lamp sockets 8 form an enclosed body, and the formed chamber is filled with the heat conducting liquid 9 with high heat-transfer capability. The light distributing lampshade 6 in the embodiment of the present invention is of a cylindrical shape, and is open at one end, and is connected with the lamp sockets 8 via sealing gaskets. The size of the light distributing lampshade 6 is designed to be fitted with the size of the hollow inner container 5 and the size of the lamp sockets 8 at both ends of the light distributing lampshade 6. The light distributing lampshade 6 is made of transparent materials such as glass, plastic or PVC, and its surface may be further processed by sand blasting, powder coating and frosting and so on to meet the requirements of various illuminating effects. Besides, it is also possible to achieve different light intensities and different illumination areas by adjusting the curvature of the surface of the lampshade.

The hollow inner container 5 and its side fins in the embodiment may be configured into various shapes and sizes which are convenient for heat removing. For example, the through holes 22 may be distributed over the whole area of the side fins. Alternatively, each side fin may be formed by a plurality of wings being in the same plane.

In the embodiment, the hollow inner container 5 and the bracket 10 may be formed separately or integrally.

The outer surface of the hollow inner container 5 in the embodiment, except a portion of the outer surface connected with the LED substrate 3, is coated with a reflective coating layer. The reflective coating layer may reflect light, which is reflected back by a lamp shell after being emitted, towards the outside to increase the utility rate of the emitted light.

The heat conducting liquid 9 in the embodiment may be liquid having a high heat-transfer performance, a low viscosity, a high refractive index, a low volatility, a low freezing point and a relatively stable property, e.g., water, heat-transfer oil, deionized water or glycol solution, which is convenient for removing heat generated from the LED light source and other elements of the illuminating device. The heat transfer liquid may be electrically-conductive liquid or non-electrically-conductive liquid, or may be particulate liquid gel and transparent solid which are made of macromolecule and nanometer material.

The LED light source 4 in the embodiment is welded on the LED substrate 3. The LED substrate 3 is tightly connected to the lower end of the hollow inner container 5 through the sliding grooves. Surface of the LED substrate 3 is in contact with the heat conducting liquid 9, and heat may be transferred by convection and conduction.

The light distributing lampshade 6 in the embodiment functions as the lamp shell and the lampshade simultaneously.

The LED driver 2 in the embodiment supplies the power to the LED through the power cord 7. The LED driver 2 is a switch power supply, and may be directly connected to the mains supply. When the heat conducting liquid is non-electrically-conductive liquid, the LED driver 2 may be designed as non-isolated power supply.

The power cord 7 in the embodiment passes through the chamber of the hollow inner container 5, and is connected with the input end of the LED driver 2.

In the case that the strip-shaped LED lamp is used as a daylight lamp, the strip-shaped LED lamp in the embodiment may be mounted by taking down a mounted daylight lamp, removing a ballast and a starter, replacing with the LED daylight lamp, and applying 220V AC mains supply to the LED daylight lamp directly.

Figure 2C:
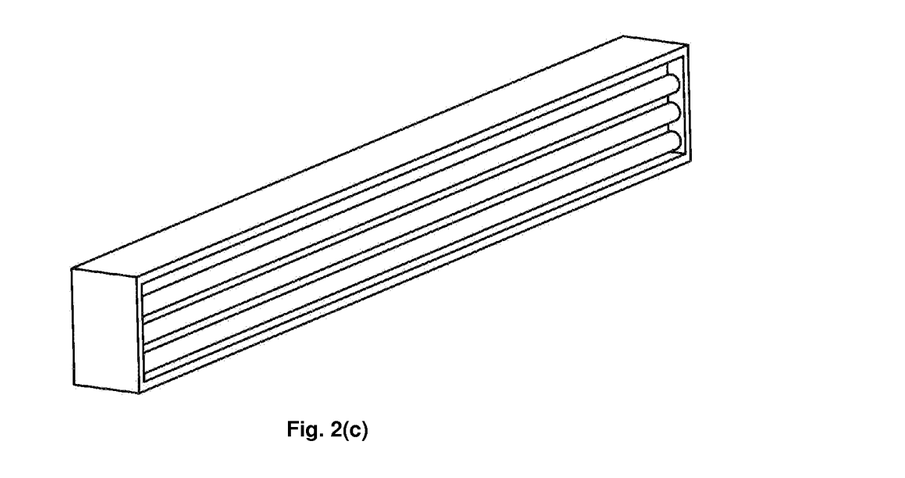

A plurality of the strip-shaped LED lamps according to the embodiment may be arranged together, and are mounted in a lamp shell as a module, which is applicable to street lamp or tunnel lamp, as shown in FIG. 2c.

As shown in FIG. 3, the second embodiment of the present invention is shown. The embodiment of the present invention provides a hollow liquid-cooling strip-shaped LED lamp including plug-in electrical connectors 1, a LED driver 2, LED substrate(s) 3, LED light source(s) 4, a lampshade 6, a hollow inner container 5, a power cord 7, lamp sockets 8 and heat conducting liquid 9. The electrical connectors 1 are provided at two ends of the strip-shaped LED lamp, and are connected to the mains supply externally, and are connected to the input end of the LED driver 2 internally. A chamber between the hollow inner container 5 and the lampshade 6 is filled with heat conducting liquid having high heat-transfer capability. The LED driver 2 is provided within the lamp socket 8 at one end of the strip-shaped LED lamp. The LED light source 4 is provided on the LED substrate 3. The LED substrate 3 is closely connected to the outer end surface of the hollow portion of the integral lampshade 5 through the sliding groove. The LED light source 4 is immersed in the heat conducting liquid 9 inside the integral lampshade 5.

In the embodiment, the lampshade 6 and the hollow inner container 5 are configured into an integral structure. The hollow inner container 5 is formed by a part of arc surface of the tubular lampshade 6 and a five-sided body. The chamber 50 is of a completely closed structure. Three LED substrates are closely attached on three flat surfaces of the outer wall of the hollow inner container 5, respectively.

The lampshade 6 in the embodiment is of a tubular structure which is open at one end, and is connected with the lamp sockets 8 via sealing gaskets. The lampshade 5 is made of acrylic, glass or other light-weight environmental protective materials. In different embodiments, the surfaces of the lampshade 5 through which light passes may be manufactured into glazed surfaces or frosted surfaces.

Figure 3A:
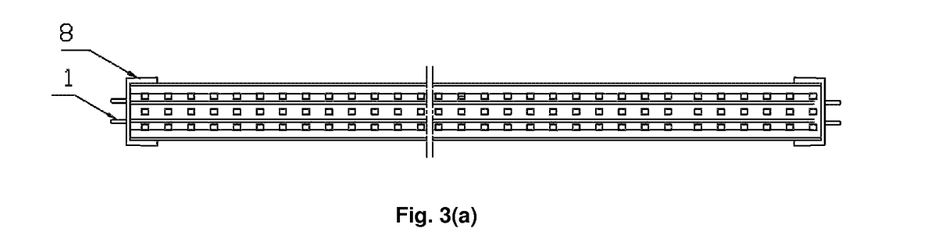
FIG. 3 is a schematic view of a hollow liquid-cooling strip-shaped LED lamp according to a second embodiment of the present invention.
Figure 3B:
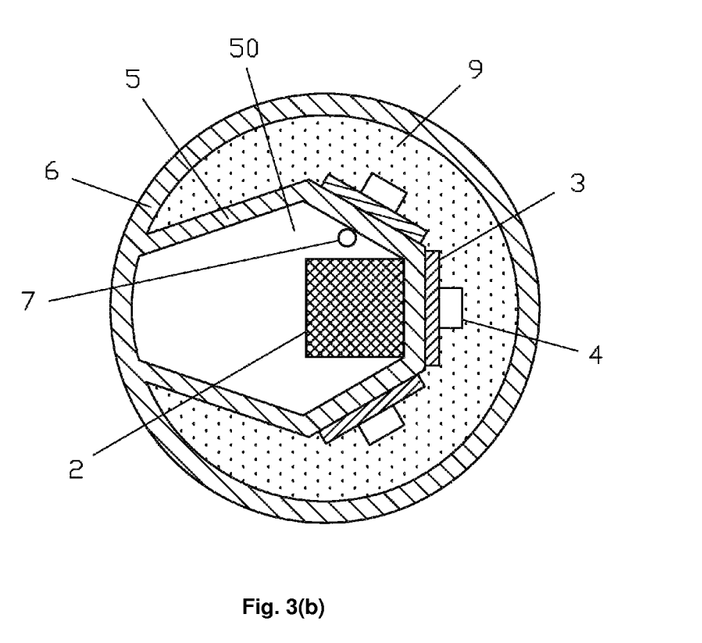

The strip-shaped LED lamp in the embodiment is applicable as LED daylight lamp and "wash wall" and the like, as shown in FIG. 3a and FIG. 3b which shows the section view of the strip-shaped LED lamp.

Figure 3C:
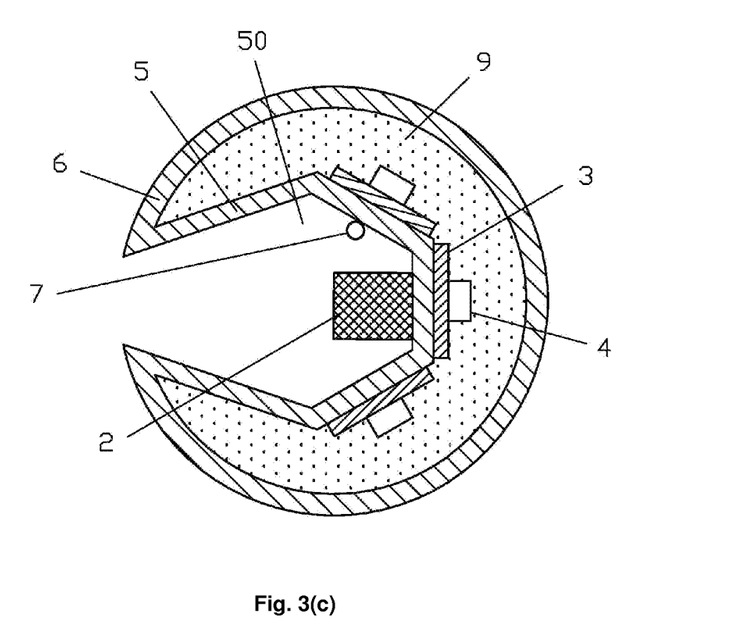

For the strip-shaped LED lamp in the embodiment, its lampshade 6 may be of a partial-open structure as shown in FIG. 3c. The lampshade 6 may have an opening at its upper portion, and the angle and the position of the opening may be adjusted appropriately as long as the heat removing requirement can be met, which is substantially convenient for replacing the LED driver 2 and increases the heat removing areas.

Figure 3D:
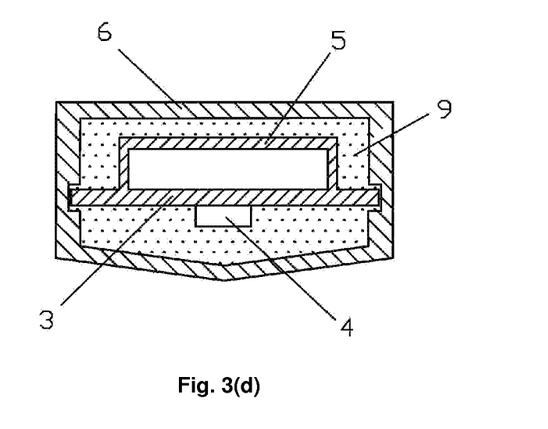

The cross section of the strip-shaped LED lamp in the embodiment may be in the shape as shown in FIG. 3d, or may be in the shape of square or rectangle or the like. Thus, the volume of the strip-shaped lamp may be reduced to meet requirements in various applications and improve the illuminating effect.

The other structures of the hollow liquid-cooling strip-shaped LED lamp in the embodiment are similar to that in the first embodiment described above.

Figure 4A:
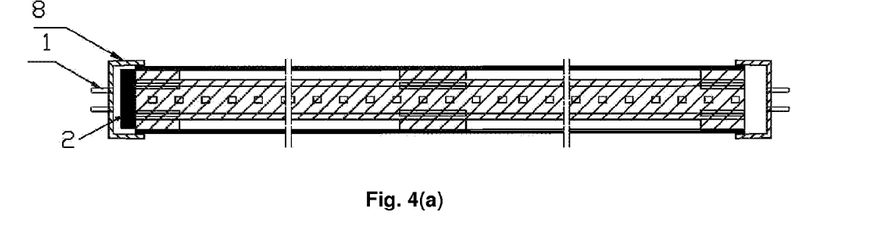
FIG. 4 is a schematic view of a hollow liquid-cooling strip-shaped LED lamp according to a third embodiment of the present invention.
Figure 4B:
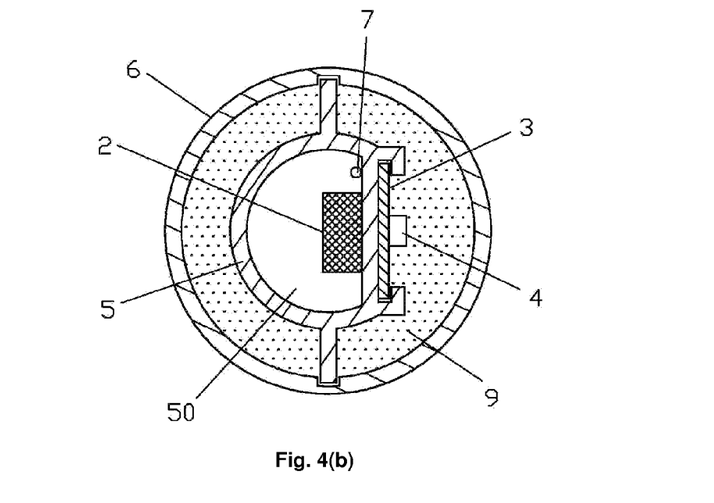

As shown in FIG. 4, the third embodiment of the present invention is shown. The embodiment of the present invention provides a hollow liquid-cooling strip-shaped LED lamp including plug-in electrical connectors 1, a LED driver 2, a LED substrate 3, LED light source(s) 4, a hollow inner container 5, a light distributing lampshade 6, a power cord 7, lamp sockets 8 and heat conducting liquid 9. The electrical connectors 1 are provided at two ends of the strip-shaped LED lamp, and are connected to the mains supply externally, and are connected to the input end of the LED driver 2 internally. A chamber formed by the hollow inner container 5 and the light distributing lampshade 6 is filled with heat conducting liquid having high heat-transfer capability. The LED driver 2 is provided within the hollow inner container 5. The LED light source 4 is provided on the LED substrate 3. The LED substrate 3 is closely connected with the lower end of the hollow inner container 5 through sliding grooves. The LED light source 4 is disposed within the light distributing lampshade 6. The hollow inner container 5 is inserted in the light distributing lampshade 6, and fixed with the light distributing lampshade 6 by side fins with through hole(s) at the two sides of the hollow inner container 5 and recesses of the light distributing lampshade 6.

The LED driver 2 in the embodiment may be disposed within a chamber 50 of the hollow inner container 5 of the strip-shaped LED lamp, or may be disposed within a lamp socket 8 at one end of the strip-shaped LED lamp. The LED driver 2 supplies the power to the LED through the power cord 7. The LED driver 2 is a switch power supply, and may be directly connected to the mains supply. When the heat conducting liquid is non-electrically-conductive liquid, the LED driver 2 may be designed as non-isolated power supply.

The other structures of the hollow liquid-cooling strip-shaped LED lamp in the embodiment are similar to that in the first embodiment described above.

Figure 5A:
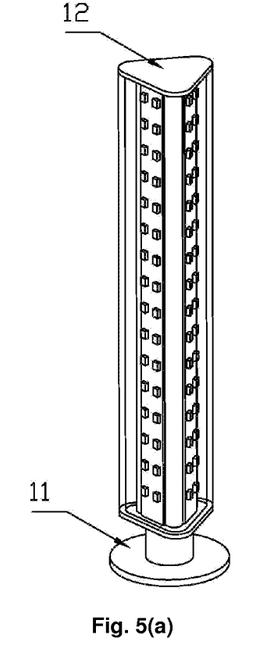
FIG. 5 is a schematic view of a hollow liquid-cooling strip-shaped LED lamp according to a fourth embodiment of the present invention.
Figure 5B:
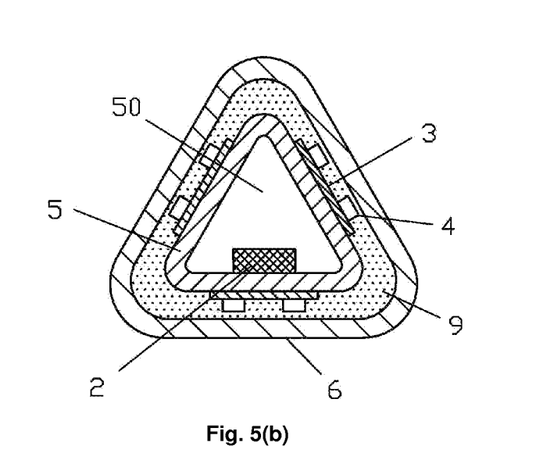

As shown in FIG. 5, the fourth embodiment of the present invention is shown. The embodiment of the present invention provides a hollow liquid-cooling strip-shaped LED lamp including a LED driver 2, LED substrate(s) 3, LED light source(s) 4, a hollow inner container 5, a light distributing lampshade 6, heat conducting liquid 9, a base 11 and a top cap 12. The electrical connectors 1 are provided at the bottom end of the strip-shaped LED lamp, and are connected to the input end of the LED driver 2 internally, and are connected to the mains supply through the base 11 externally. A chamber formed by the hollow inner container 5 and the light distributing lampshade 6 is filled with heat conducting liquid having high heat-transfer capability. The LED driver 2 is provided within the hollow inner container 5 or in the base 11 of the strip-shaped LED lamp. The LED light source 4 is provided on the LED substrate 3. The LED substrate 3 is closely connected with the lower end of the hollow inner container 5 by a snap-fit structure. The LED light source 4 is disposed within the light distributing lampshade 6. The hollow inner container 5 is inserted in the light distributing lampshade 6, and fixed with the light distributing lampshade 6 via an interface at the bottom of the hollow inner container 5.

The electrical connector 1 in the embodiment may be a pin-type connector or a connector in any other forms which may engage the connector of the power supply in the base and facilitate the maintenance or replacement later.

In the embodiment, the hollow inner container 5 and the light distributing lampshade 6 form a enclosed body, and the formed chamber is filled with the heat conducting liquid 9 with high heat-transfer capability. The light distributing lampshade 6 in the embodiment of the present invention is in the shape of a triangular prism being open at the top, and is connected with the top cap 12 via a sealing gasket. The light distributing lampshade 6 is made of plastic, glass or other light-weight environmental protective materials. In different embodiments, the surface of the light distributing lampshade 6 may be manufactured into glazed surfaces or frosted surfaces.

For example, according to the different embodiment of the present invention, the hollow inner container 5 may be configured into various shapes and sizes which are convenient for removing heat.

The LED light source 4 in the embodiment is welded on the LED substrate 3. The LED substrate 3 is connected to the lower end of the hollow inner container 5, and is immersed in the heat conducting liquid, with its surface being in close contact with the heat conducting liquid 9, which is beneficial to effectively transmit heat by convection and conduction.

The LED driver 2 in the embodiment may be disposed in the chamber 50 of the hollow inner container 5 of the strip-shaped LED lamp, or may be disposed in the base 11 of the strip-shaped LED lamp. The LED driver 2 is a switch power supply, and may be directly connected to the mains supply. When the heat conducting liquid is non-electrically-conductive liquid, the LED driver 2 may be designed as non-isolated power supply.

In the embodiment, the hollow inner container 5 and the light distributing lampshade 6 may be formed separately or integrally.

The hollow inner container 5 in the embodiment may have two or more surfaces connected with the substrate 3. The LEDs on the substrates located on different surfaces of the hollow inner container 5 may be the same color, or may be different color.

The base 11 in the embodiment may be a fixed base, or may be a base having rotation function. When the LEDs on the substrates located on different surfaces of the hollow inner container 5 have different color, the rotation function may produce ornate visual effect or achieve special advertisement effect, which is applicable to the advertisement lamp.

The strip-shaped LED lamp in the embodiment may be powered by batteries in the case that the strip-shaped LED lamp is designed to have a small volume and a low power.

The light distributing lampshade 6 is made of transparent material such as glass, plastic or PMMA, and its surface may be processed by sand blasting, powder coating and frosting, so as to meet the requirements of various illuminating effects. Besides, it is also possible to achieve different light intensities and different illumination areas by adjusting the curvature of the surface of the lampshade.

The other structures of the hollow liquid-cooling strip-shaped LED lamp in the embodiment are similar to that in the first embodiment described above.

Figure 6A:
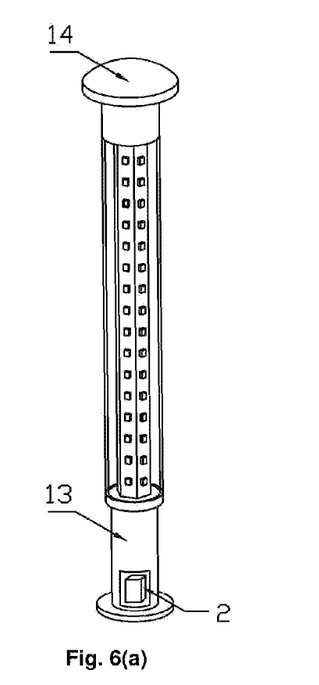
FIG. 6 is a schematic view of a hollow liquid-cooling strip-shaped LED lamp according to a fifth embodiment of the present invention.

As shown in FIG. 6, the fifth embodiment of the present invention is shown. The embodiment of the present invention provides a hollow liquid-cooling strip-shaped LED lamp including a LED driver 2, LED substrate(s) 3, LED light source(s) 4, a hollow inner container 5, a light distributing lampshade 6, heat conducting liquid 9, a base 13 and a top cover 14. The strip-shaped light emitter is disposed between the base 13 and the top cover 14. The LED driver 2 is disposed within the base 13 of the strip-shaped LED lamp. A chamber formed by the hollow inner container 5 and the light distributing lampshade 6 is filled with heat conducting liquid having high heat-transfer capability. The LED light source 4 is provided on the LED substrate 3. The LED substrate 3 is fixed with the lower end of the light distributing lampshade 6. The hollow inner container 5 is inserted in the light distributing lampshade 6, and fixed with the light distributing lampshade 6 via an interface at the bottom of the hollow inner container 5.

The LED driver 2 in the embodiment may be disposed within the hollow inner container 5, or may be disposed in the base 13 of the strip-shaped LED lamp, so as to facilitate the maintenance or replacement.

Figure 6B:
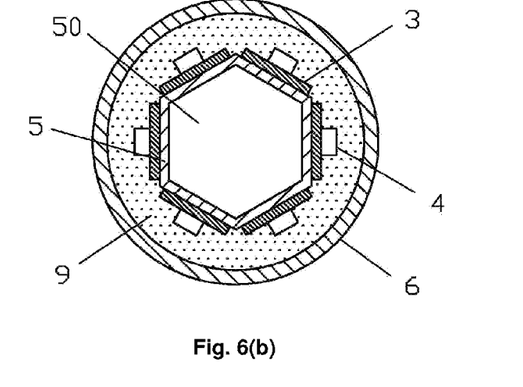

The hollow inner container 5 in the embodiment may be of a hexagonal prism shape, or may be of a cylindrical shape or any other shape which is advantageous for illuminating from multiple sides, and thus a multi-direction illuminating effect may be achieved by the light source 4 and the LED substrate 3 fixed on the hollow inner container 5, as shown in FIG. 6b which shows the cross section of the lamp.

The strip-shaped LED lamp in the embodiment is suitable for applications such as landscape lamp.

The other structures of the hollow liquid-cooling strip-shaped LED lamp in the embodiment are similar to that in the first embodiment described above.

It should be noted that, the above description is only made with reference to the specific embodiments of the present invention. Obviously, the present invention is not limited to the above embodiments, and many variations may be made. All variations directly deduced or conceived from the disclosure of the present invention by those skilled in the art should be deemed to fall into the protection scope of the present invention.

It should be understood that, the above embodiments are only used to explain the present invention, but not limit the present invention, and any invention-creation without departing from the spirit of the present invention falls into the protection scope of the present invention.

What is claimed is:

1. A hollow liquid-cooled strip-shaped LED lamp, comprising a LED driver, a LED light source, a LED substrate, a light distributing lampshade, electrical connectors at two ends of the lamp and a lamp socket, wherein a hollow inner container is provided in the light distributing lampshade, a chamber between the hollow inner container and the light distributing lampshade is filled with heat conducting liquid, the LED substrate is immersed in the heat conducting liquid, the LED substrate is disposed so as to be closely attached to an outer surface of the hollow inner container.

2. The hollow liquid-cooling strip-shaped LED lamp according to claim 1, wherein a bracket is provided on an outer surface of the hollow inner container, the LED substrate is disposed on the bracket.

3. The hollow liquid-cooling strip-shaped LED lamp according to claim 2, wherein the LED substrate is disposed in sliding grooves provided on the bracket.

4. The hollow liquid-cooling strip-shaped LED lamp according to claim 1, wherein the hollow inner container is connected with recesses in the light distributing lampshade by two side fins of the hollow inner container.

5. The hollow liquid-cooling strip-shaped LED lamp according to claim 4, wherein the two side fins are provided with through holes.

6. The hollow liquid-cooling strip-shaped LED lamp according to claim 1, wherein a plurality of LED light sources are disposed on the LED substrate in a single row or multiple rows.

7. The hollow liquid-cooling strip-shaped LED lamp according to claim 1, wherein the LED driver is disposed within the chamber of the hollow inner container or the lamp socket at one end.

8. The hollow liquid-cooling strip-shaped LED lamp according to claim 1, wherein the heat conducting liquid is water, heat-transfer oil, deionized water or glycol solution.

9. The hollow liquid-cooling strip-shaped LED lamp according to claim 1, wherein a surface of the LED substrate is provided with a reflective coating layer.

* * * * *